(12) United States Patent
Niwa et al.

(10) Patent No.: US 10,777,674 B2
(45) Date of Patent: Sep. 15, 2020

(54) SEMICONDUCTOR DEVICE

(71) Applicant: TOYODA GOSEI CO., LTD., Kiyosu-shi, Aichi-ken (JP)

(72) Inventors: Takaki Niwa, Kiyosu (JP); Toru Oka, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 0 days.

(21) Appl. No.: 16/351,930

(22) Filed: Mar. 13, 2019

(65) Prior Publication Data
US 2019/0305126 A1   Oct. 3, 2019

(30) Foreign Application Priority Data

Mar. 28, 2018 (JP) ................................. 2018-061910

(51) Int. Cl.
*H01L 29/15* (2006.01)
*H01L 31/0256* (2006.01)
(Continued)

(52) U.S. Cl.
CPC ...... *H01L 29/7806* (2013.01); *H01L 29/1095* (2013.01); *H01L 29/2003* (2013.01);
(Continued)

(58) Field of Classification Search
USPC .......................... 257/76, 194, 192, 285, 197, 257/E29.246–E29.253; 438/167, 172
See application file for complete search history.

(56) References Cited

U.S. PATENT DOCUMENTS 8,896,058 B2 * 11/2014 Okada .................. H01L 29/407
257/302
9,455,248 B2 * 9/2016 Hebert ................ H01L 29/0619
(Continued)

FOREIGN PATENT DOCUMENTS

JP          2011-35072 A       2/2011

*Primary Examiner* — Niki H Nguyen
(74) *Attorney, Agent, or Firm* — Posz Law Group, PLC

(57) ABSTRACT

To suppress breakage of a diode. A semiconductor device comprises a stacked body and a first electrode. The stacked body includes a first nitride semiconductor layer, a second nitride semiconductor layer, a third nitride semiconductor layer, and a fourth nitride semiconductor layer that are stacked in sequence. The first electrode is in contact with a surface of the first nitride semiconductor layer that is opposite to a surface in contact with the second nitride semiconductor layer. The semiconductor device includes a transistor forming region and a diode forming region adjacent to the transistor forming region. The transistor forming region includes a first groove, a second electrode, and a third electrode. The first groove has a bottom portion located in the second nitride semiconductor layer. The second electrode is formed on a surface of the first groove. The third electrode is in contact with a surface of the fourth nitride semiconductor layer that is opposite to a surface in contact with the third nitride semiconductor layer. The diode forming region includes a second groove and a Schottky electrode. The second groove has a bottom portion located in the third nitride semiconductor layer. The Schottky electrode makes a Schottky barrier junction with the third nitride semiconductor layer and is electrically connected to the third electrode.

3 Claims, 14 Drawing Sheets

(51) Int. Cl.
*H01L 29/78* (2006.01)
*H01L 29/20* (2006.01)
*H01L 29/417* (2006.01)
*H01L 29/10* (2006.01)

(52) U.S. Cl.
CPC .. *H01L 29/41741* (2013.01); *H01L 29/41766* (2013.01); *H01L 29/7813* (2013.01)

(56) References Cited

U.S. PATENT DOCUMENTS

| | | | |
|---|---|---|---|
| 2011/0204381 A1* | 8/2011 | Okada | H01L 27/0727 257/76 |
| 2013/0313638 A1* | 11/2013 | Yoshimochi | H01L 29/7813 257/334 |
| 2014/0346594 A1* | 11/2014 | Hebert | H01L 29/401 257/334 |

* cited by examiner

SEMICONDUCTOR DEVICE

CROSS-REFERENCE TO RELATED APPLICATIONS

The present application claims priority from Japanese patent application. 2018-061910 filed on Mar. 28, 2018, the entirety of the content of which is hereby incorporated by reference into this application.

BACKGROUND

Field

The present disclosure relates to a semiconductor device.

Related Art

Some semiconductor devices include a transistor forming region where a transistor is formed and a diode forming region where a diode is formed. In a diode forming region of a semiconductor device disclosed in JP2011-35072A, a second nitride semiconductor layer containing an n-type impurity is stacked on a first nitride semiconductor layer containing an n-type impurity, and a Schottky electrode is formed to make a Schottky barrier junction with the second nitride semiconductor layer.

In the semiconductor device disclosed in JP2011-35072A, when a voltage applied between a drain electrode and a source electrode becomes close to a breakdown resistance of the transistor, a leakage current starts to flow to the diode. As a result, in some cases, a high electric field region is formed in part of the second nitride semiconductor layer that is closer to the first nitride semiconductor layer and breaks the diode. In order to solve such circumstances, a technique for suppressing breakage of the diode has been called for.

SUMMARY

According to one aspect of the disclosure, a semiconductor device is provided. This semiconductor device comprises a stacked body and a first electrode. The stacked body includes: a first nitride semiconductor layer containing an n-type impurity; a second nitride semiconductor layer containing an n-type impurity; a third nitride semiconductor layer containing a p-type impurity; and a fourth nitride semiconductor layer containing an n-type impurity. The first nitride semiconductor layer, the second nitride semiconductor layer, the third nitride semiconductor layer, and the fourth nitride semiconductor layer are stacked in sequence. The first electrode is in contact with a surface of the first nitride semiconductor layer that is opposite to a surface in contact with the second nitride semiconductor layer. The semiconductor device includes a transistor forming region where a transistor is formed and a diode forming region where a diode is formed. The diode for ng region is adjacent to the transistor forming region. The transistor forming region includes a first groove, a second electrode, and a third electrode. The first groove penetrates the third nitride semiconductor layer and the fourth nitride semiconductor layer and has a bottom portion located in the second nitride semiconductor layer. The second electrode is formed on a surface of the first groove through an insulation film. The third electrode is in contact with a surface of the fourth nitride semiconductor layer that is opposite to a surface in contact with the third nitride semiconductor layer. The diode forming region includes a second groove and a Schottky electrode. The second groove penetrates the fourth nitride semiconductor layer and has a bottom portion located in the third nitride semiconductor layer. The Schottky electrode is formed on a surface of the second groove, makes a Schottky barrier junction with the third nitride semiconductor layer, and is electrically connected to the third electrode.

DETAILED DESCRIPTION

A. First Embodiment

Figure 1:
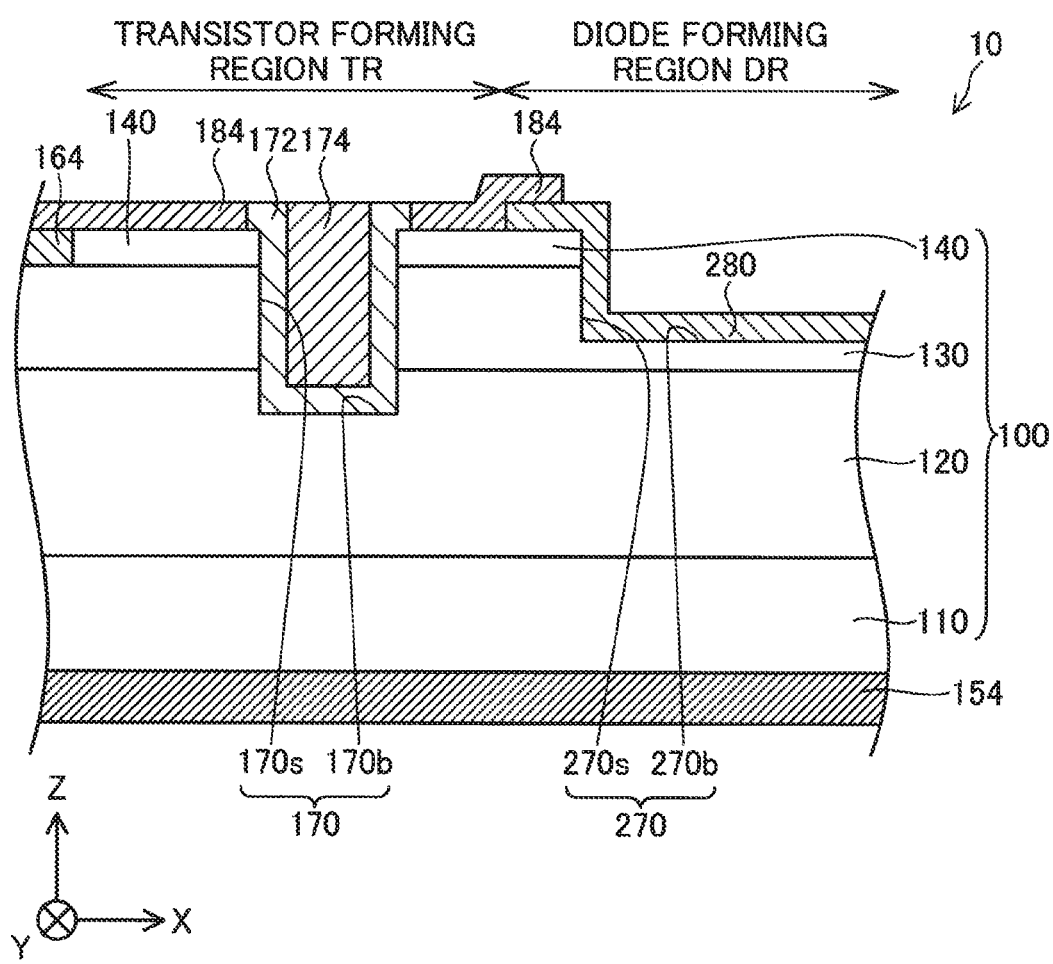
FIG. 1 is a schematic diagram illustrating part of a semiconductor device according to a first embodiment in cross section.

FIG. 1 is a schematic diagram illustrating part of a semiconductor device 10 according to a first embodiment in cross section. It should be noted that FIG. 1 and the following schematic diagrams are provided to clarify technical features of the semiconductor device 10 and are not intended for indicating dimensions of each component accurately. For ease of description, XYZ axes substantially orthogonal to one another are illustrated in FIG. 1. The XYZ axes in FIG. 1 correspond to XYZ axes in FIG. 3.

The semiconductor device 10 includes a substrate 110, an n-type semiconductor layer 120, a p-type semiconductor layer 130, an n-type semiconductor layer 140, and a first electrode 154. The semiconductor device 10 is an npn-type semiconductor device and has a structure in which the substrate 110, the n-type semiconductor layer 120, the p-type semiconductor layer 130, and the n-type semiconductor layer 140 are stacked in sequence.

The substrate 110, the n-type semiconductor layer 120, the p-type semiconductor layer 130, and the n-type semiconductor layer 140 are plate-shaped semiconductors extended along the X axis and the Y axis. According to this embodiment, the substrate 110, the n-type semiconductor layer 120, the p-type semiconductor layer 130, and the n-type semiconductor layer 140 are gallium nitride (GaN)-based semiconductors. Examples of the gallium nitride-based semiconductors (GaN) may include not only gallium nitride (GaN) but also aluminum gallium nitride (AlGaN), indium gallium nitride (InGaN), and indium aluminum gallium nitride (InAlGaN). It should be noted that in view of use for semiconductor devices for power control, gallium nitride (GaN) and aluminum gallium nitride (AlGaN) are preferable. According to this embodiment, gallium nitride (GaN) is used. It should be noted that insofar as the effects of this embodiment can be obtained, part of gallium nitride (GaN) may be replaced with other Group III elements such as aluminum (Al) and indium (In), and that gallium nitride (GaN) may contain other impurities.

The substrate 110 is a semiconductor containing an n-type impurity. According to this embodiment, the substrate 110 has a concentration of silicon (Si) of 5E17 cm$^{-3}$ or higher as the n-type impurity. According to this embodiment, the substrate 110 has a thickness (length in the Z-axis direction) equal to or larger than 30 μm and equal to or less than 500 μm. It should be noted that an expression 5E17 indicates $5 \times 10^{17}$.

The n-type semiconductor layer 120 is a semiconductor containing an n-type impurity. According to this embodiment, the n-type semiconductor layer 120 is located on the +Z-axis direction side of the substrate 110. According to this embodiment, the n-type semiconductor layer 120 has a concentration of silicon (Si) equal to or higher than 1E15 cm$^{-3}$ and equal to or less than 1E16 cm$^{-3}$ as the n-type impurity. According to this embodiment, the n-type semiconductor layer 120 has a thickness equal to or larger than 0.1 μm and equal to or less than 20 μm. The n-type semiconductor layer 120 is also called "n-type drift layer 120".

The p-type semiconductor layer 130 is a semiconductor containing a p-type impurity. The p-type semiconductor layer 130 is located on the +Z-axis direction side of the n-type semiconductor layer 120. According to this embodiment, the p-type semiconductor layer 130 contains magnesium (Mg) as an acceptor element. According to this embodiment, the p-type semiconductor layer 130 has a concentration of magnesium (Mg) equal to or higher than 1E17 cm$^{-3}$ and equal to or less than 5E19 cm$^{-3}$ as the p-type impurity. According to this embodiment, the p-type semiconductor layer 130 has a thickness equal to or larger than 0.5 μm and equal to or less than 1.5 μm. The p-type semiconductor layer 130 is also called "p-type base layer 130".

The n-type semiconductor layer 140 is a semiconductor containing an n-type impurity. According to this embodiment, the n-type semiconductor layer 140 is located on the +Z-axis direction side of the p-type semiconductor layer 130. According to this embodiment, the n-type semiconductor layer 140 contains silicon (Si) as a donor element. According to this embodiment, the n-type semiconductor layer 140 has a concentration of silicon (Si) equal to or higher than 1E18 cm$^{-3}$ as the n-type impurity, which is higher than the concentration of silicon (Si) of the n-type semiconductor layer 120. The n-type semiconductor layer 140 has a thickness (length in the Z-axis direction) equal to or larger than 0.1 μm and equal to or less than 1.0 μm.

According to this embodiment, a structure in which the n-type semiconductor layer 120, the p-type semiconductor layer 130, and the n-type semiconductor layer 140 are stacked on the substrate 110 in sequence is called stacked body 100.

The first electrode 154 is an electrode in ohmic contact with a −Z-axis direction side surface of the substrate 110. According to this embodiment, the first electrode 154 is an electrode formed by stacking a layer made of aluminum (Al) on a layer made of titanium (Ti) and subjecting the stacked layers to heat treatment. The first electrode 154 is also called "drain electrode 154".

The semiconductor device 10 includes a transistor forming region TR where a transistor is formed and a diode forming region DR where a diode is formed. According to this embodiment, a trench-gate metal-oxide-semiconductor field effect transistor (MOSFET) as a vertical MOS transistor is formed in the transistor forming region TR. A pn junction diode is formed in the diode forming region DR. The transistor forming region TR and the diode forming region DR have the stacked body 100 and the first electrode 154 in common.

In addition to the stacked body 100 and the first electrode 154, the transistor forming region TR of the semiconductor device 10 includes a body electrode 164, a first groove 170, an insulation film 172, a second electrode 174, and a third electrode 184.

The body electrode 164 is formed in a groove recessed by grinding part of the n-type semiconductor layer 140. The body electrode 164 is an electrode in ohmic contact with a surface of the p-type semiconductor layer 130 that faces the +Z-axis direction.

The first groove 170 penetrates the p-type semiconductor layer 130 and the n-type semiconductor layer 140 and has a bottom portion 170b located in the n-type semiconductor layer 120. The n-type semiconductor layer 120, the p-type semiconductor layer 130, and the n-type semiconductor layer 140 are exposed to a side portion 170s of the first groove 170. The insulation film 172 covers the first groove 170 and part of a surface of the n-type semiconductor layer 140 close to the first groove 170 in the X-axis direction. The second electrode 174 is a gate electrode formed in the first groove 170 through the insulation film 172. When a voltage is applied to the second electrode 174, an inversion layer is formed in the p-type semiconductor layer 130 and serves as a channel so as to form a conductive path between the first electrode 154 and the third electrode 184, which is described later. The second electrode 174 is also called "gate electrode 174".

The third electrode 184 is an electrode in ohmic contact with a surface of the n-type semiconductor layer 140 opposite to the surface in contact with the p-type semiconductor layer 130. According to this embodiment, the third electrode 184 is an electrode formed by stacking a layer made of aluminum (Al) on a layer made of titanium (Ti) and subjecting the stacked layers to heat treatment. The third electrode 184 is also called "source electrode 184".

In addition to the stacked body 100 and the first electrode 154, the diode forming region DR of the semiconductor device 10 includes a second groove 270 and a Schottky electrode 280.

The second groove 270 penetrates the n-type semiconductor layer 140 and has a bottom portion 270b located in the p-type semiconductor layer 130. The p-type semiconductor layer 130 and the n-type semiconductor layer 140 are exposed to a side portion 270s of the second groove 270. The Schottky electrode 280 is an electrode that makes a Schottky barrier junction with an interface of the p-type semiconductor layer 130. The Schottky electrode 280 includes one or more metal layers mainly made of at least one of nickel (Ni), palladium (Pd), platinum (Pt), iridium (Ir), and the like. According to this embodiment, the Schottky electrode 280 includes a single metal layer mainly made of nickel (Ni).

The Schottky electrode 280 is electrically connected to the third electrode 184. According to this embodiment, at a boundary between the transistor forming region TR and the diode forming region DR, the Schottky electrode 280 is electrically connected to the third electrode 184. It should be noted that the electrical connection between the Schottky electrode 280 and the third electrode 184 may be implemented either in the transistor forming region TR or in the diode forming region DR.

Figure 2:
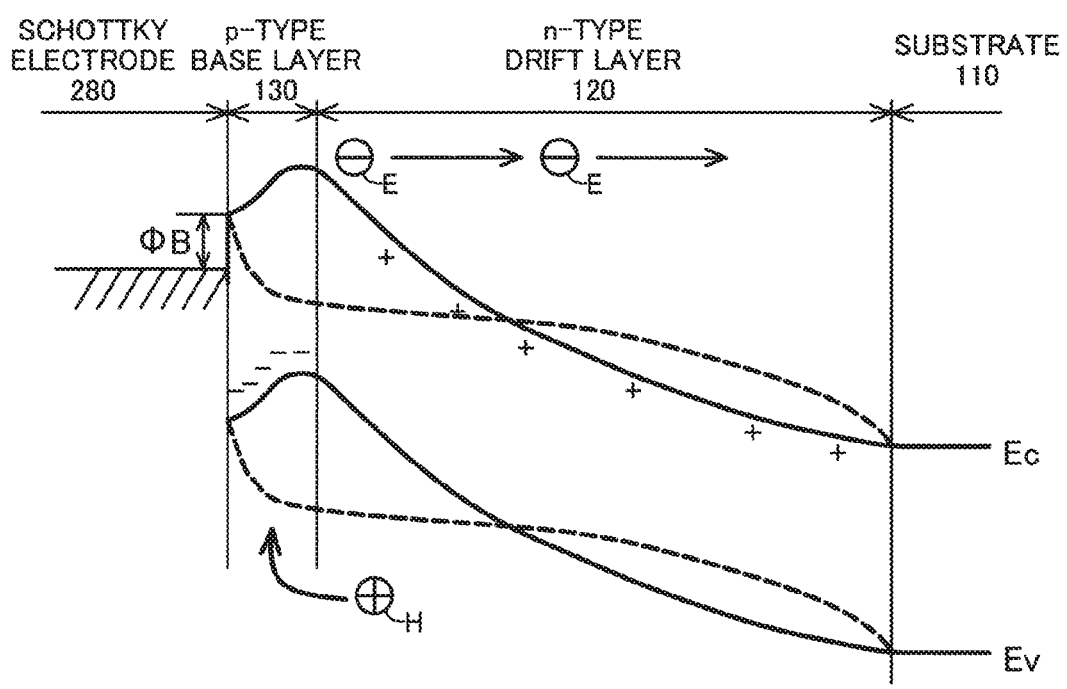
FIG. 2 is a band diagram illustrating band structure plots in a diode forming region.

FIG. 2 is a band diagram illustrating how band structure changes when a leakage current flows in the diode forming region DR of the semiconductor device 10. In FIG. 2, the vertical axis represents electron energy (potential energy). FIG. 2 indicates a conduction band Ec and a valence band Ev. In FIG. 2, a Schottky barrier TB is indicated between the Schottky electrode 280 and the conduction band Ec. Similarly, in FIGS. 4 to 8, the conduction band Ec, the valence band Ev, and the Schottky barrier φB are indicated.

Solid lines in FIG. 2 are band diagram in the diode forming region DR when a space charge of the p-type base layer 130 is negative. Dashed lines in FIG. 2 are band diagram in the diode forming region DR when a space charge of the p-type base layer 130 is positive. It should be noted that the solid lines and the dashed lines in FIG. 2 overlap each other in the substrate 110.

With no voltage being applied to the gate electrode 174, the space charge in the p-type base layer 130 is negative owing to a space charge of the acceptor because a depletion layer is formed at an interface between the p-type base layer 130 and the n-type drift layer 120. Consequently, when no voltage is applied to the gate electrode 174, the band diagram of the diode forming region DR are in a state indicated by the solid lines. It should be noted that formation of the depletion layer causes donor ions to take on a positive charge and acceptor ions to take on a negative charge, and that plus signs (+) and minus signs (−) in FIG. 2 respectively indicate the charge of the donor ions and the charge of the acceptor ions.

According to this embodiment, preferably, the p-type base layer 130 has a thickness equal to or less than such a thickness that the p-type base layer 130 is completely depleted when the depletion layer is formed. Here, being completely depleted means that the p-type base layer 130 have no positive holes.

With no voltage being applied to the gate electrode 174, when a voltage between the drain electrode 154 and the source electrode 184 becomes close to a breakdown resistance of the diode, avalanche breakdown occurs in the diode forming region DR to make a leakage current start to flow. FIG. 2 illustrates an electron E and a positive hole H formed when the avalanche breakdown occurs. Next, electrons E flow from the n-type drift layer 120 toward the substrate 110, and positive holes H flow from the n-type drift layer 120 toward the p-type base layer 130 and are accumulated in the p-type base layer 130. The positive hole H in FIG. 2 indicates an accumulated positive hole H. The accumulated positive holes H cause the space charge in the p-type base layer 130 to change from negative to positive. A band structure plot when the potential is uniformly positive is convex downward. Consequently, when the leakage current flows in the diode forming region DR while no voltage is applied to the gate electrode 174, the band diagram of the diode forming region DR are in a state indicated by the dashed lines.

Figure 3:
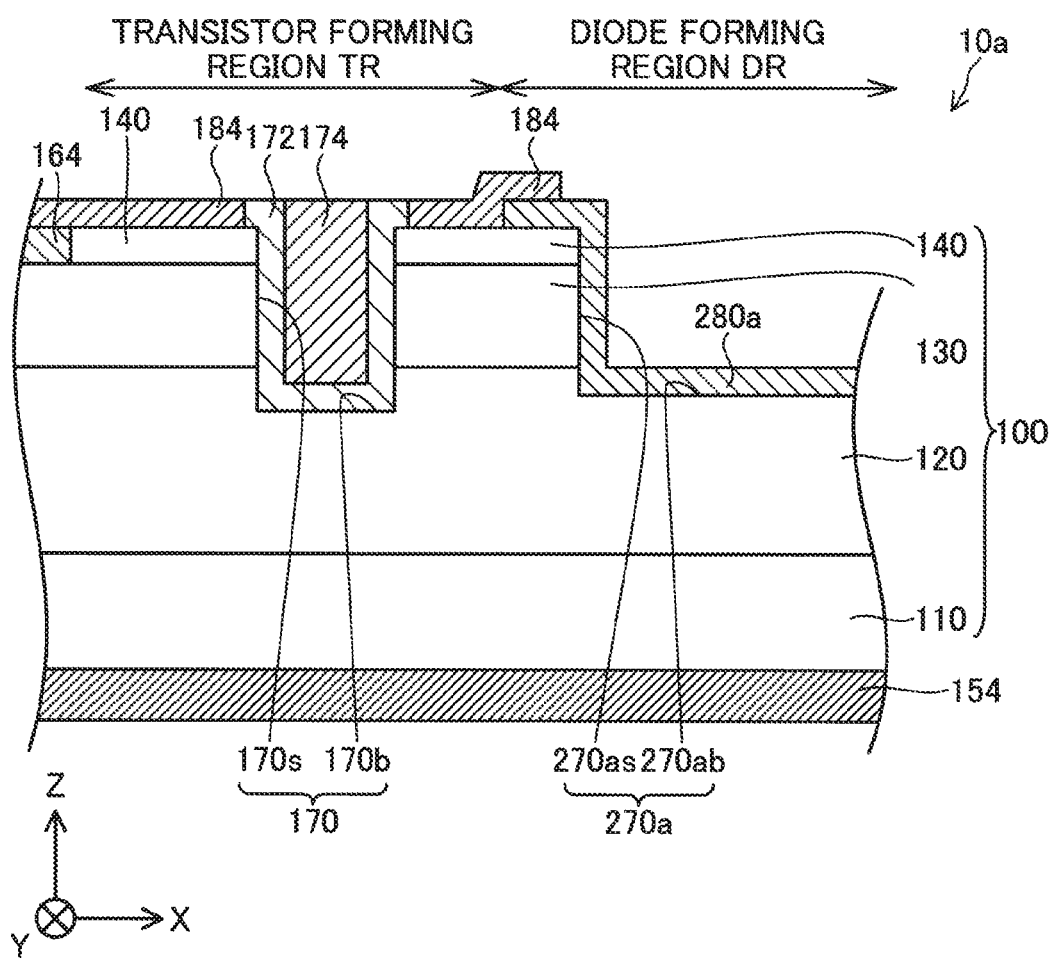
FIG. 3 is a schematic diagram illustrating part of a semiconductor device according to a comparative example in cross section.

FIG. 3 is a schematic diagram illustrating part of a semiconductor device 10a according to a comparative example in cross section. The semiconductor device 10a has substantially the same structure as the semiconductor device 10 according to the first embodiment except for including a second groove 270a and a Schottky electrode 280a that are different from the corresponding components of the semiconductor device 10 according to the first embodiment. The semiconductor device 10a according to the comparative example will be hereinafter referred to also as the comparative example. The same reference numerals as those of the first embodiment are used to represent the same structures as those of the first embodiment, and the preceding description is referred to.

The second groove 270a penetrates the n-type semiconductor layer 140 and the p-type semiconductor layer 130 and has a bottom portion 270ab located in the n-type semiconductor layer 120. The n-type semiconductor layer 140, the p-type semiconductor layer 130, and the n-type semiconductor layer 120 are exposed to a side portion 270as of the second groove 270a. The Schottky electrode 280a is an electrode that makes a Schottky barrier junction with an interface of the n-type semiconductor layer 120. In a similar manner to the Schottky electrode 280 according to the first embodiment, the Schottky electrode 280a is electrically connected to the third electrode 184.

Figure 4:
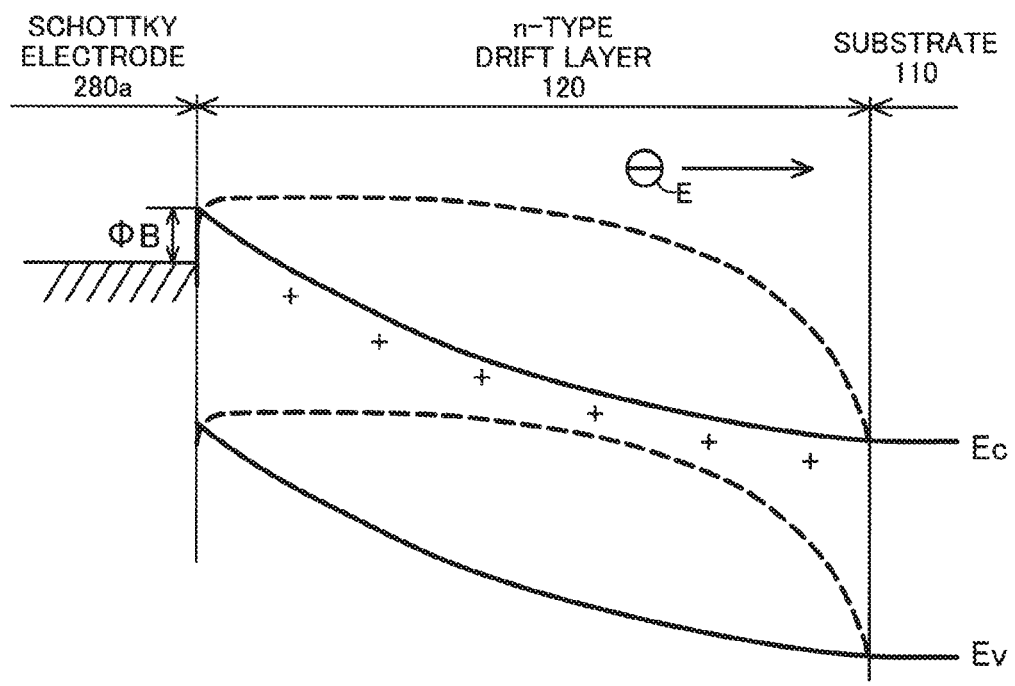
FIG. 4 is a band diagram illustrating band structure plots in the diode forming region.

FIG. 4 is a band diagram illustrating band structure plots in the diode forming region DR in the comparative example. Solid lines in. FIG. 4 are band diagram in the diode forming region DR when a space charge of the n-type drift layer 120 is positive. Dashed lines in FIG. 4 are band diagram in the diode forming region DR when a space charge of the n-type drift layer 120 is negative. It should be noted that the solid lines and the dashed lines in FIG. 4 overlap each other in the substrate 110.

With no voltage being applied to the gate electrode 174 in the comparative example, junction with the Schottky electrode 280a causes electrons that have existed in the n-type drift layer 120 to be diffused toward the substrate 110, and therefore, the space charge in the n-type drift layer 120 is positive owing to the donor. Consequently, when no voltage is applied to the gate electrode 174, the band diagram of the diode forming region DR in the comparative example are in a state indicated by the solid lines. It should be noted that diffusion of the electrons toward the substrate 110 causes donor ions to take on a positive charge, and that plus signs (+) in FIG. 4 indicate the charge of the donor ions.

With no voltage being applied to the gate electrode 174 in the comparative example, when a voltage between the drain electrode 154 and the source electrode 184 becomes close to a breakdown resistance of the diode, avalanche breakdown occurs in the diode forming region DR to make a leakage current start to flow. In a similar manner to the electron E in FIG. 2, FIG. 4 illustrates an electron E that flows when the avalanche breakdown occurs. Next, electrons E flow from the n-type drift layer 120 toward the substrate 110. This causes the space charge in the n-type drift layer 120 to change from positive to negative. A band structure plot when the potential is uniformly negative is convex upward. Consequently, when the leakage current flows in the diode forming region DR while no voltage is applied to the gate electrode 174, the band diagram of the diode forming region DR are in a state indicated by the dashed lines. In this state, a high electric field region is formed in part of the n-type drift layer 120 that is closer to the substrate 110 and makes the diode in the diode forming region DR more likely to be broken.

In contrast, in the semiconductor device 10 according to the first embodiment, when the leakage current flows, the band diagram of the diode forming region DR are in the state indicated by the clashed lines in FIG. 2. This can restrain a high electric field region from being formed in the part of the n-type drift layer 120 that is closer to the substrate 110 so as to suppress breakage of the diode in the diode forming region DR.

Figure 5:
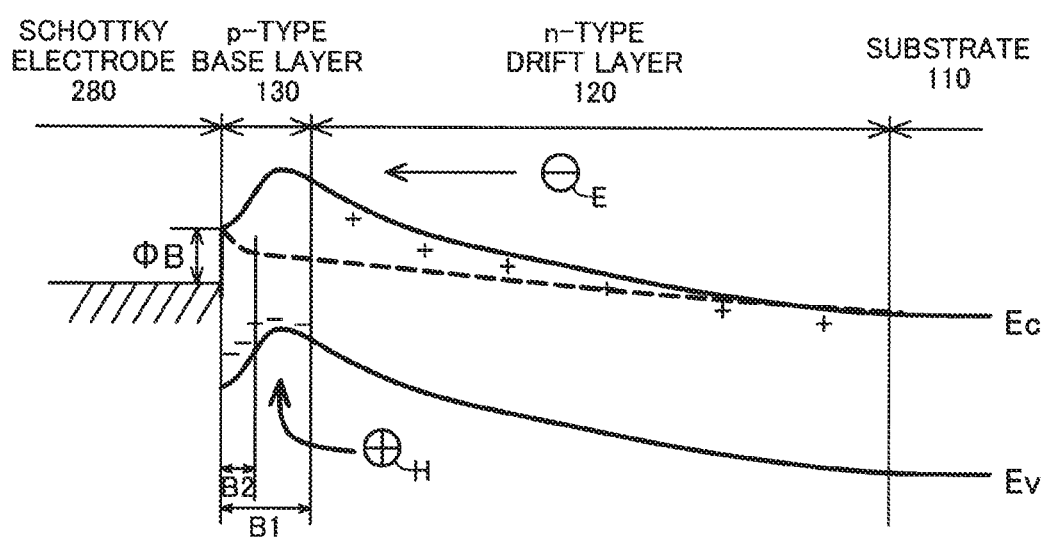
FIG. 5 is a band diagram illustrating band structure plots in the diode forming region.

FIG. 5 is a band diagram illustrating how band structure changes in the diode forming region DR of the semiconductor device 10 due to switching by the transistor. Solid lines in FIG. 5 are band diagram in the diode forming region DR before positive holes are accumulated in the p-type base layer 130. Dashed lines in FIG. 5 are band diagram in the diode forming region DR after positive holes are accumulated in the p-type base layer 130.

The band diagram in the diode forming region DR before the transistor starts switching and positive holes are accumulated in the p-type base layer 130 are in a state indicated by the solid lines in FIG. 5. Consequently, a width B1 of an energy barrier is so large that a leakage current is restrained from flowing. Due to the switching by the transistor, positive holes H flow in the p-type base layer 130 from the transistor forming region TR to the diode forming region DR, and the positive holes H are accumulated in the p-type base layer 130 in the diode forming region DR. The accumulated positive holes cause the space charge in the p-type base layer 130 in the diode forming region DR to change from negative to positive. A positive hole H in FIG. 5 indicates the positive holes that flow in the p-type base layer 130 from the transistor forming region TR to the diode forming region DR. A band structure plot when the potential is uniformly positive is convex downward. Consequently, when the transistor starts switching and positive holes H are accumulated in the p-type base layer 130 in the diode forming region DR, the band diagram of the diode forming region DR are in a state indicated by the dashed lines. In this state, the width of the energy barrier in the p-type base layer 130 changes from the width B1 to a width B2 and becomes thinner. Therefore, when the transistor stops switching and becomes off, a tunneling current becomes more likely to flow between the Schottky electrode 280 and the n-type drift layer 120. That is, electrons E become more likely to flow between the n-type drift layer 120 and the Schottky electrode 280 so as to supply the electrons to the p-type base layer 130. The electron E in FIG. 5 indicates electrons that flow in the diode forming region DR when switching is stopped. As the positive holes H accumulated in the p-type base layer 130 recombine with the supplied electrons, an amount of the positive holes H accumulated in the p-type base layer 130 decreases. This makes it possible to quickly stop conduction in a parasitic bipolar transistor when the transistor stops switching and becomes off. Here, the parasitic bipolar transistor refers to an npn junction bipolar transistor including the substrate 110, the n-type drift layer 120, the p-type base layer 130, and the n-type semiconductor layer 140.

According to this embodiment, preferably, the p-type base layer 130 is designed to have such a thickness that the width B2 of the energy barrier is equal to or less than 10 nm when positive holes H are accumulated in the p-type base layer 130 in the diode forming region DR. The reason is that this thickness makes a tunneling current more likely to flow.

Figure 6:
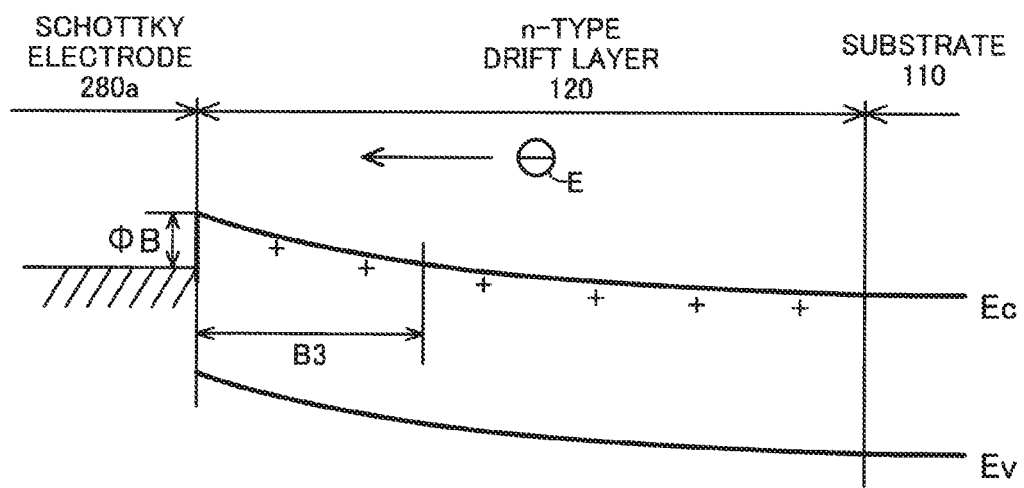
FIG. 6 is a band diagram illustrating band structure plots in the diode forming region.

FIG. 6 is a band diagram illustrating how band structure changes in the diode forming region DR of the semiconductor device 10a according to the comparative example when the transistor performs switching. Solid lines in FIG. 6 are band diagram in the diode forming region DR when the transistor performs switching. In the comparative example as well, due to the switching by the transistor, positive holes are accumulated in the p-type base layer 130. In this state, even when the transistor stops switching and becomes off, the amount of positive holes accumulated in the p-type base layer 130 is less likely to decrease than in the semiconductor device 10. Consequently, time from when the transistor stops switching and becomes off to when conduction in the parasitic bipolar transistor is stopped is longer than in the semiconductor device 10. In contrast, in the semiconductor device 10, after the transistor stops switching and becomes off, the positive holes accumulated in the p-type base layer 130 are quickly decreased by the electrons supplied to the p-type base layer 130. This makes it possible to quickly stop conduction in the parasitic bipolar transistor.

Referring back to FIG. 1, as a result of thorough investigation, the inventors of the present disclosure have made it clear that an unintentional n-type impurity region of a relatively high concentration is formed on a surface of a gallium nitride (GaN)-based semiconductor layer. It is considered that such a highly concentrated n-type impurity region is formed for the following reasons: in the manufacturing process of a gallium nitride (GaN)-based semiconductor device, for example, when a surface of a gallium nitride (GaN)-based semiconductor layer is exposed to the air, silicon (Si) adsorbs on the surface of the semiconductor layer, and when grooves are formed in the semiconductor layer, nitrogen (N) escapes from the surface of the semiconductor layer. The highly concentrated n-type impurity region has a donor concentration, for example, equal to or higher than $8E17\ cm^{-3}$ and equal to or less than $1E20\ cm^{-3}$. For example, in the semiconductor device 10, there are cases in which an n-type impurity region is formed on a surface of the p-type base layer 130 (the bottom portion of the second groove 270) from when the second groove 270 is formed to when the Schottky electrode 280 is formed. However, in the semiconductor device 10, the p-type base layer 130 compensates for the n-type impurity region.

Figure 7:
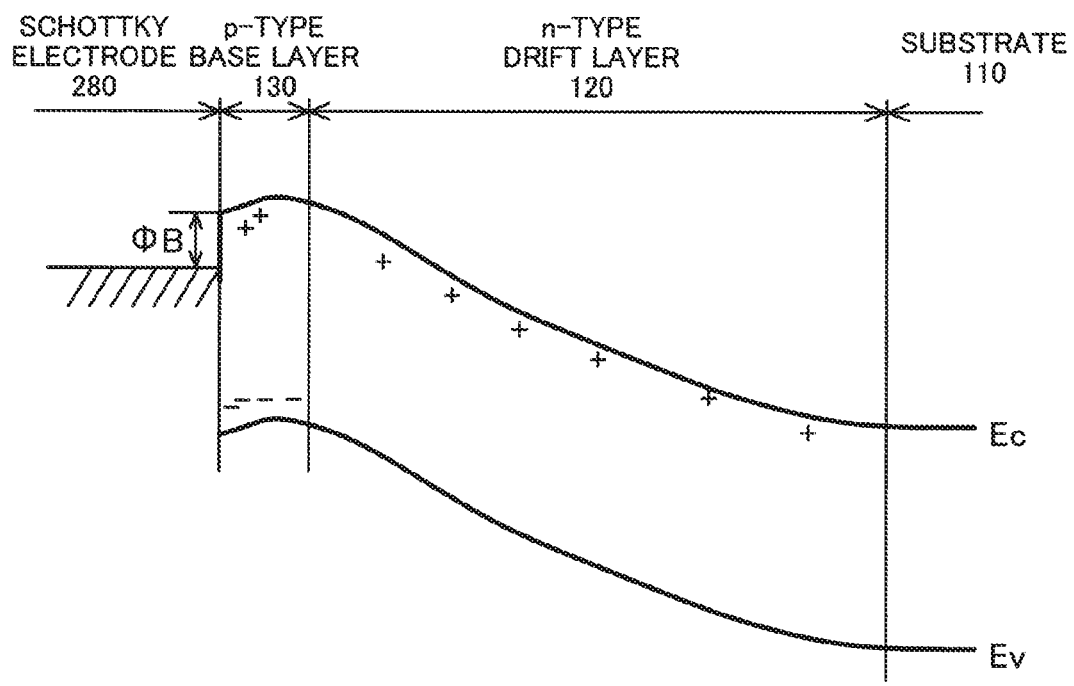
FIG. 7 is a band diagram illustrating band structure plots in the diode forming region.

FIG. 7 is a band diagram illustrating band structure plots in the diode forming region DR in the semiconductor device 10 when an unintentional n-type impurity region is formed on a surface of the p-type base layer 130 in the manufacturing process. As described above, because the p-type base layer 130 compensates for the n-type impurity region, it is possible to restrain a high electric field region from being formed in part of the p-type base layer 130 that is closer to the Schottky electrode 280.

Figure 8:
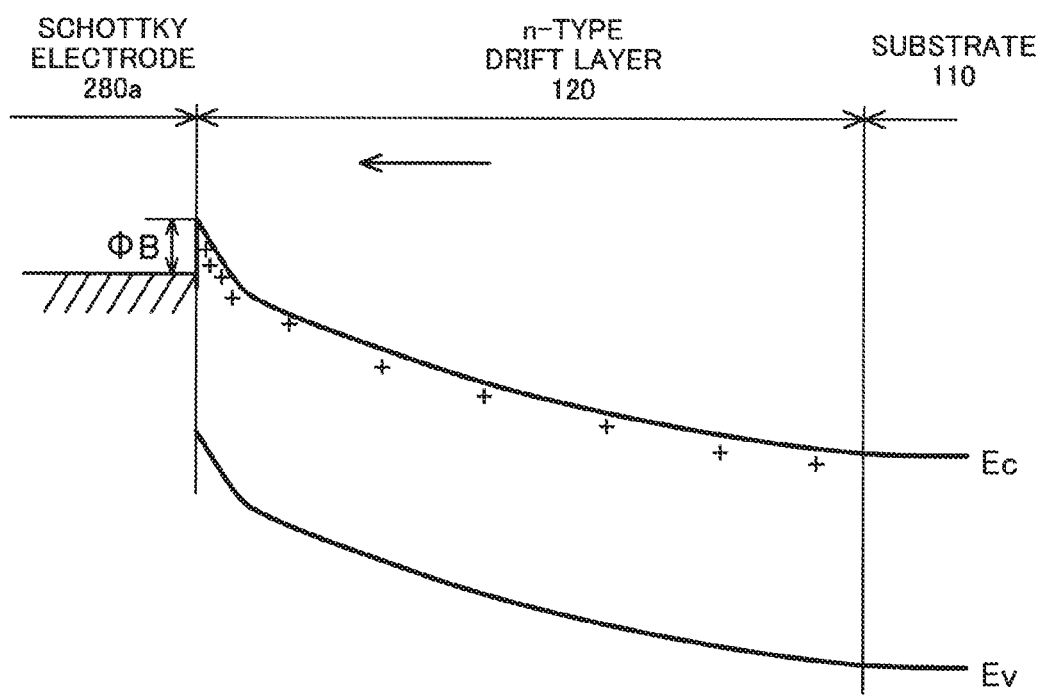
FIG. 8 is a band diagram illustrating band structure plots in the diode forming region.

FIG. 8 is a band diagram illustrating hand structure plots in the diode forming region DR in the semiconductor device 10a when an unintentional n-type impurity region is formed on a surface of the n-type drift layer 120 in the manufacturing process. In the comparative example, there are cases in which an n-type impurity region is formed on a surface of the n-type drift layer 120 (the bottom portion of the second groove 270a) from when the second groove 270a is formed to when the Schottky electrode 280a is formed. In this case, because a high electric field region is formed in part of the n-type drift layer 120 that is closer to the Schottky electrode 280a, voltage breakdown becomes more likely to occur at a low voltage. Here, the voltage breakdown refers to a state in which the diode is broken by application of a voltage of a predetermined value or higher.

According to the first embodiment described above with reference to FIG. 2, it is possible to restrain a high electric field region from being formed in the part of the n-type drift layer 120 that is closer to the substrate 110. This can suppress breakage of the diode in the diode forming region DR. As described with reference to FIG. 5, after the transistor stops switching and becomes off, the positive holes accumulated in the p-type base layer 130 are quickly decreased by the electrons supplied to the p-type base layer 130. This makes it possible to quickly stop conduction in the parasitic bipolar transistor. As described with reference to FIG. 7, even when an unintentional n-type impurity region is formed, formation of a high electric field region can be suppressed to suppress breakage of the diode in the diode forming region DR.

B. Second Embodiment

Figure 9:
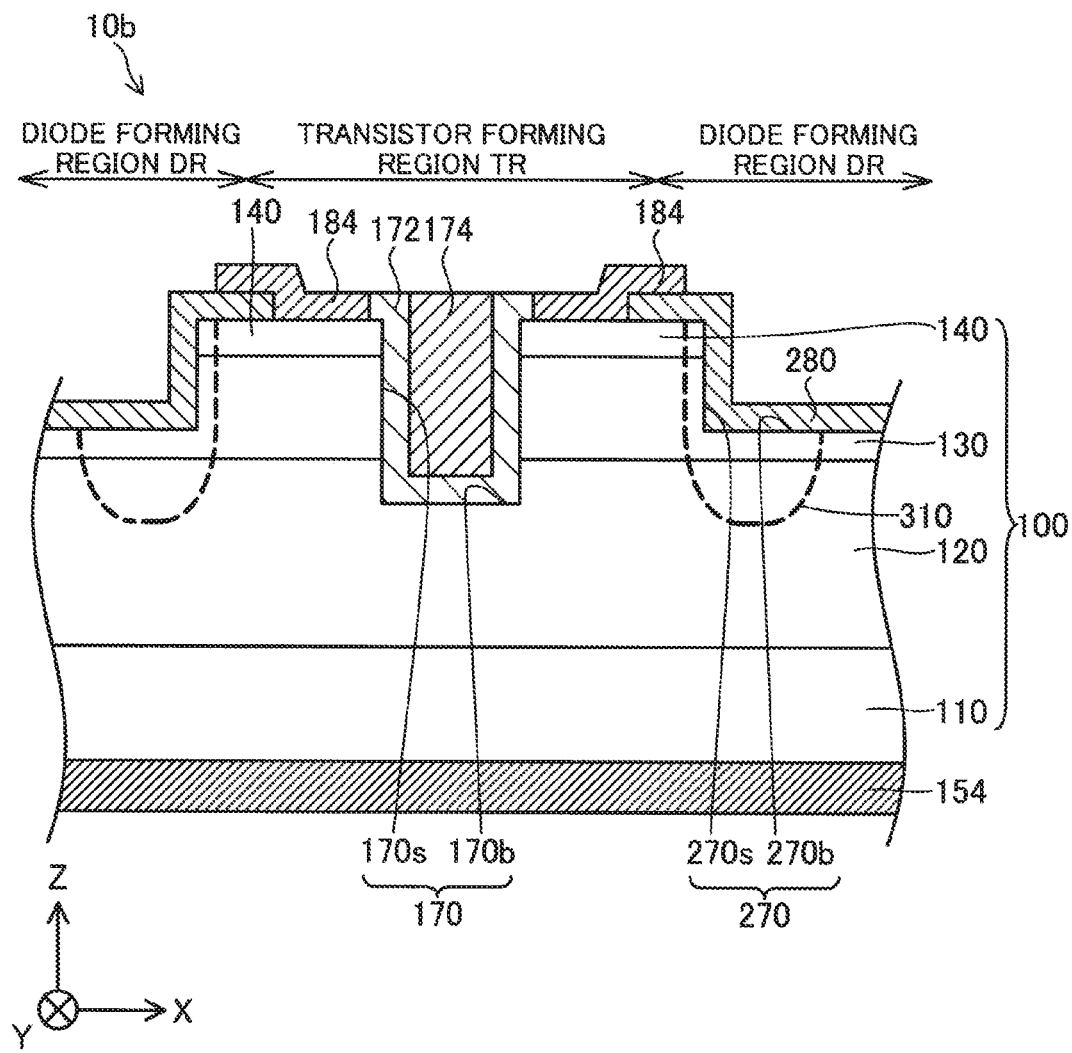
FIG. 9 is a schematic diagram illustrating part of a semiconductor device according to a second embodiment in cross section.

FIG. 9 is a schematic diagram illustrating part of a semiconductor device 10b according to a second embodiment in cross section. The semiconductor device 10b has substantially the same structure as the semiconductor device 10 according to the first embodiment except for including diode forming regions DR on both sides of the transistor forming region TR in the X-axis direction and including a p-type impurity implantation region 310 in each of the diode forming regions DR. The same reference numerals as those of the first embodiment are used to represent the same structures as those of the first embodiment, and the preceding description is referred to.

The p-type impurity implantation region 310 is a region formed by implanting a p-type impurity into the stacked body 100 through the second groove 270. The p-type impurity implantation region 310 is formed in the n-type semiconductor layer 120, the p-type semiconductor layer 130, and the n-type semiconductor layer 140 of the stacked body 100. According to this embodiment, the p-type impurity implantation region 310 contains magnesium (Mg) as the p-type impurity. According to this embodiment, the p-type impurity implantation region 310 has an average concentration of magnesium (Mg) higher than the concentration of magnesium (Mg) of the p-type semiconductor layer 130.

The p-type impurity implantation region 310 is extended to a position deeper than the bottom portion 170b of the first groove 170. In other words, the p-type impurity implantation region 310 is extended in the Z-axis direction from a level of the bottom portion 170b of the first groove 170. This can relieve electric field concentration on corners of the bottom portion 170b of the first groove 170 when a voltage is applied to the gate electrode 174. This can improve breakdown resistance of the semiconductor device 10b.

The p-type impurity implantation region 310 is extended from the side portion 270s of the second groove 270 toward the stacked body 100. Therefore, even when an unintentional n-type impurity region is formed on a surface of the side portion 270s in the manufacturing process, the p-type impurity implantation region 310 compensates for the n-type impurity region so as to suppress formation of a leak path from the n-type semiconductor layer 140 through the n-type impurity region.

According to the second embodiment described above, even when an unintentional n-type impurity region is formed on the second groove 270, the p-type impurity implantation region 310 is formed from the second groove 270 toward the stacked body 100 to do compensate for the n-type impurity region.

C. Third Embodiment

Figure 10:
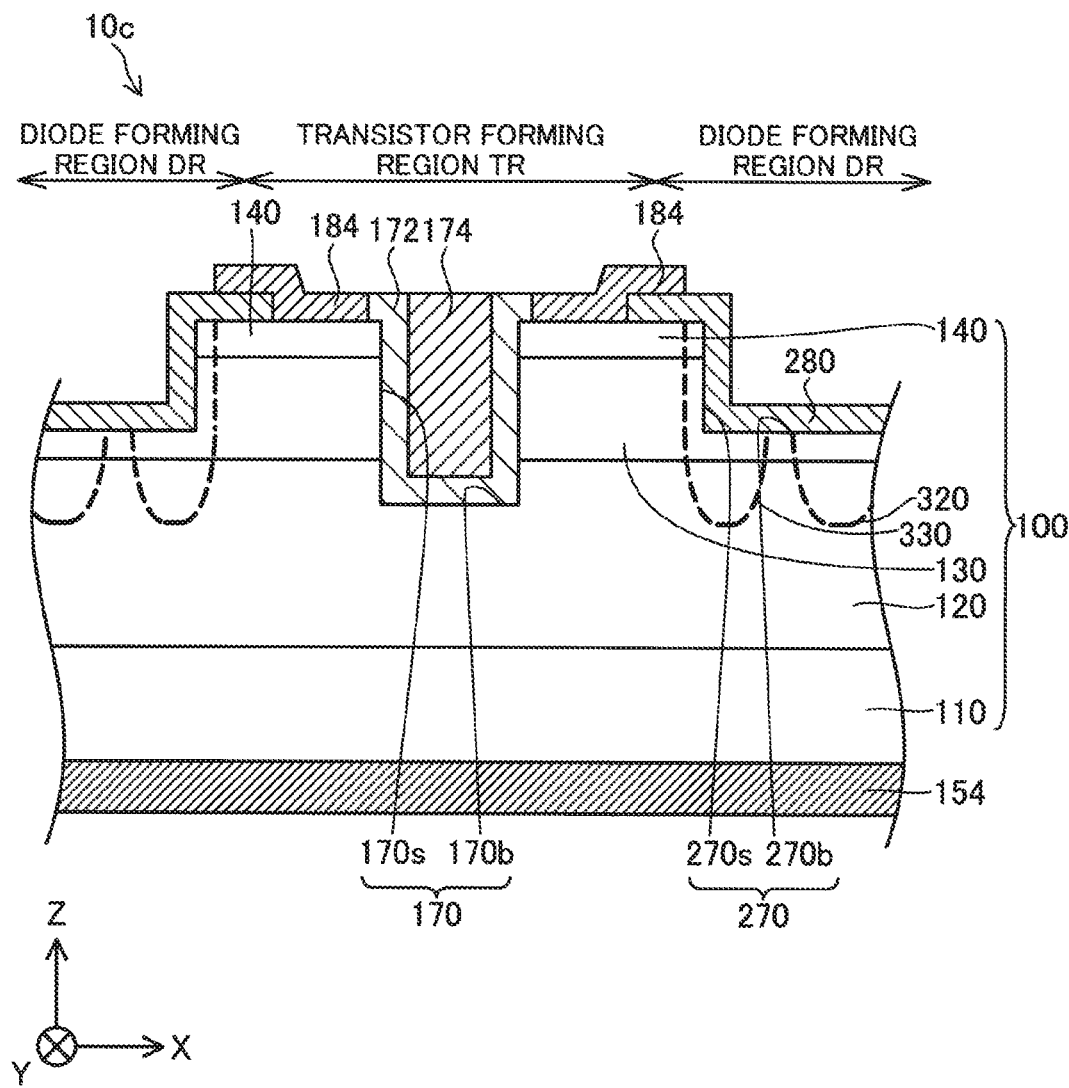
FIG. 10 is a schematic diagram illustrating part of a semiconductor device according to a third embodiment in cross section.

FIG. 10 is a schematic diagram illustrating part of a semiconductor device 10c according to a third embodiment in cross section. The semiconductor device 10c has substantially the same structure as the semiconductor device 10b according to the second embodiment except for including p-type impurity implantation regions 320 and 330 that are different from the p-type impurity implantation region 310. The same reference numerals as those of the second embodiment are used to represent the same structures as those of the second embodiment, and the preceding description is referred to.

The p-type impurity implantation region 320 is substantially the same as the p-type impurity implantation region 310 except for having a length in the X-axis direction smaller than that of the p-type impurity implantation region 310. The p-type impurity implantation region 330 is separate from the p-type impurity implantation region 320. The p-type impurity implantation region 330 is formed in the n-type semiconductor layer 120 and the p-type semiconductor layer 130.

The third embodiment described above produces substantially the same effects as the second embodiment. According to the third embodiment, the plurality of p-type impurity implantation regions are formed in the n-type semiconductor layer 120. Consequently, as described with reference to FIG. 2, when avalanche breakdown occurs in the diode forming region DR to make a leakage current start to flow, positive holes H can be effectively accumulated in the p-type base layer 130.

D. Fourth Embodiment

Figure 11:
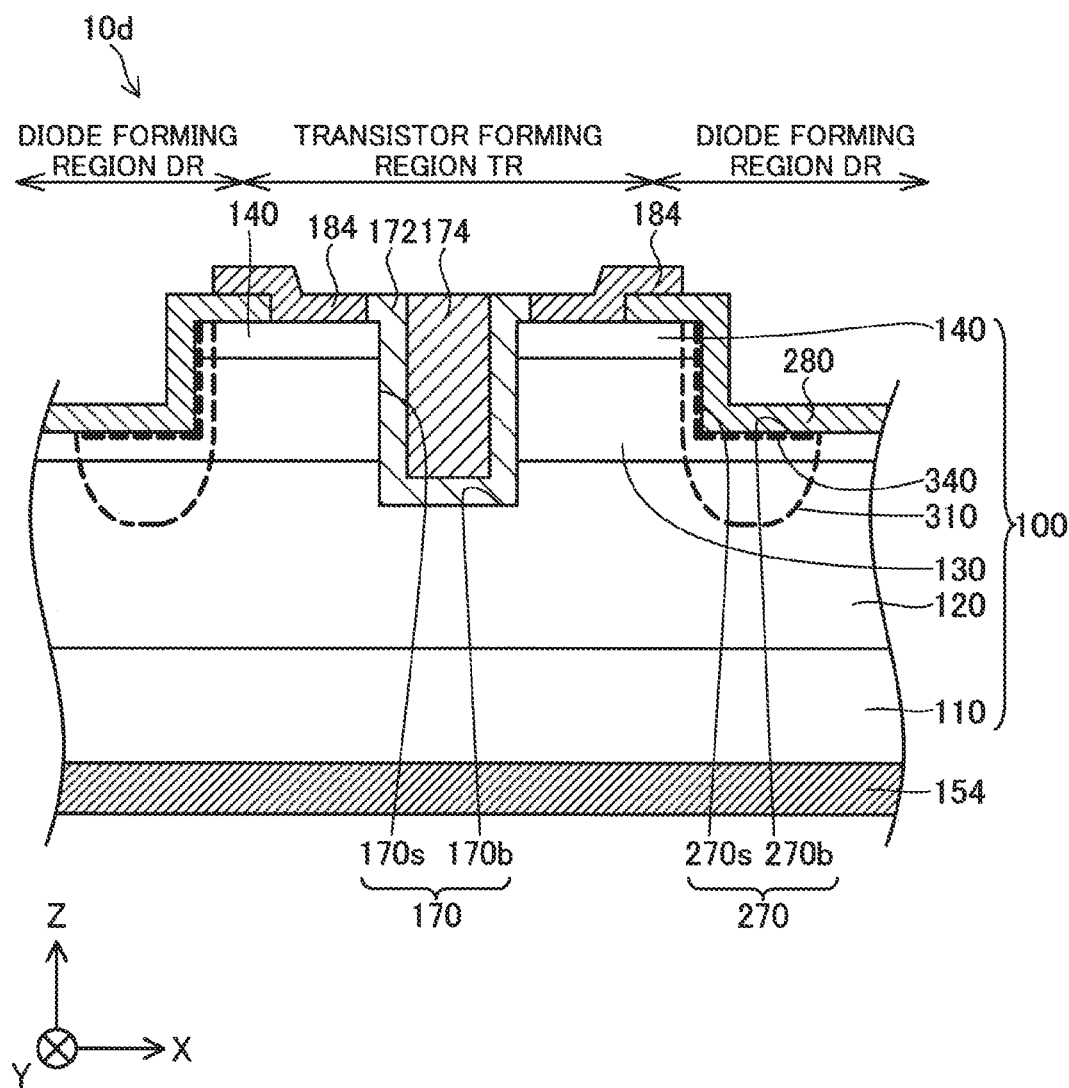
FIG. 11 is a schematic diagram illustrating part of a semiconductor device according to a fourth embodiment in cross section.

FIG. 11 is a schematic diagram illustrating part of a semiconductor device 10d according to a fourth embodiment in cross section. The semiconductor device 10d includes a p-type impurity deposition region 340 in addition to the structure of the semiconductor device 10b according to the second embodiment. The same reference numerals as those of the second embodiment are used to represent the same structures as those of the second embodiment, and the preceding description is referred to.

The p-type impurity deposition region 340 is disposed between the Schottky electrode 280 and the second groove 270. The p-type impurity deposition region 340 is a region formed by depositing a p-type impurity on a surface of the second groove 270. The p-type impurity deposition region 340 is formed by delta-doping of the p-type impurity to the second groove 270. The p-type impurity deposition region 340 is in contact with the side portion 270s and the bottom portion 270b of the second groove 270. The p-type impurity deposition region 340 contains magnesium (Mg) as the p-type impurity.

The fourth embodiment described above produces substantially the same effects as the second embodiment. Even when an unintentional n-type impurity region is formed on the second groove 270, the p-type impurity implantation region 310 and the p-type impurity deposition region 340 compensate for the n-type impurity region so as to suppress formation of a leak path from the n-type semiconductor layer 140 through the n-type impurity region.

E. Fifth Embodiment

Figure 12:
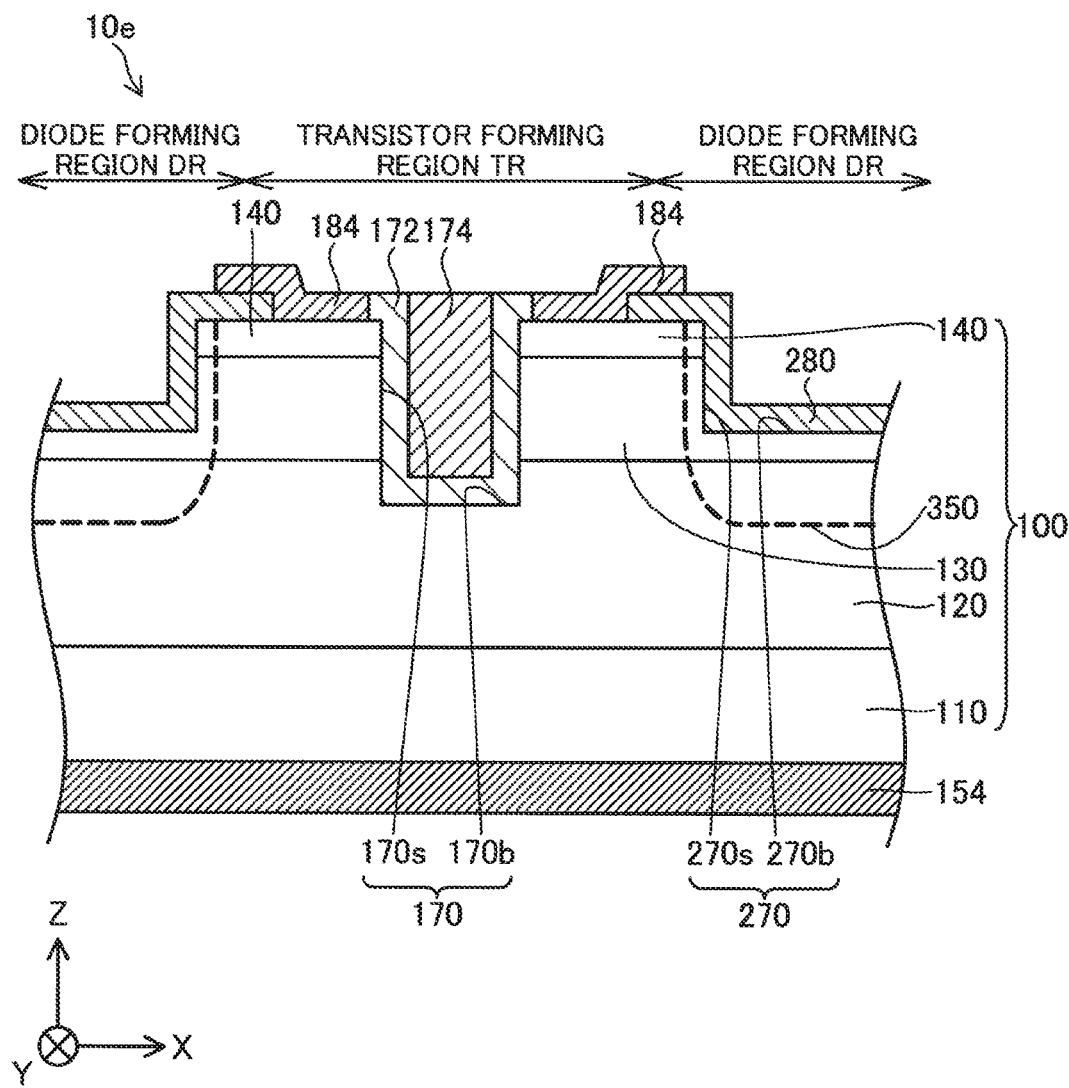
FIG. 12 is a schematic diagram illustrating part of a semiconductor device according to a fifth embodiment in cross section.

FIG. 12 is a schematic diagram illustrating part of a semiconductor device 10e according to a fifth embodiment in cross section. The semiconductor device 10e has substantially the same structure as the semiconductor device 10b according to the second embodiment except for including a p-type impurity implantation region 350 different from the p-type impurity implantation region 310. The same reference numerals as those of the second embodiment are used to represent the same structures as those of the second embodiment, and the preceding description is referred to.

The p-type impurity implantation region 350 is substantially the same as the p-type impurity implantation region 310 except for having a length in the X-axis direction larger than that of the p-type impurity implantation region 310. The p-type impurity implantation region 350 is formed in the n-type semiconductor layer 120, the p-type semiconductor layer 130, and part of the n-type semiconductor layer 120 in a range where the second groove 270 exists in the Z-axis direction in the stacked body 100.

The fifth embodiment described above produces substantially the same effects as the second embodiment. At a position where the p-type impurity implantation region 350 is formed in the part of the n-type semiconductor layer 120 in the range where the second groove 270 exists in the Z-axis direction, formation of an electric field is moderate because pn junction is moderate. This makes breakage of the pn junction less likely at the position where the p-type impurity implantation region 350 is formed.

F. Sixth Embodiment

Figure 13:
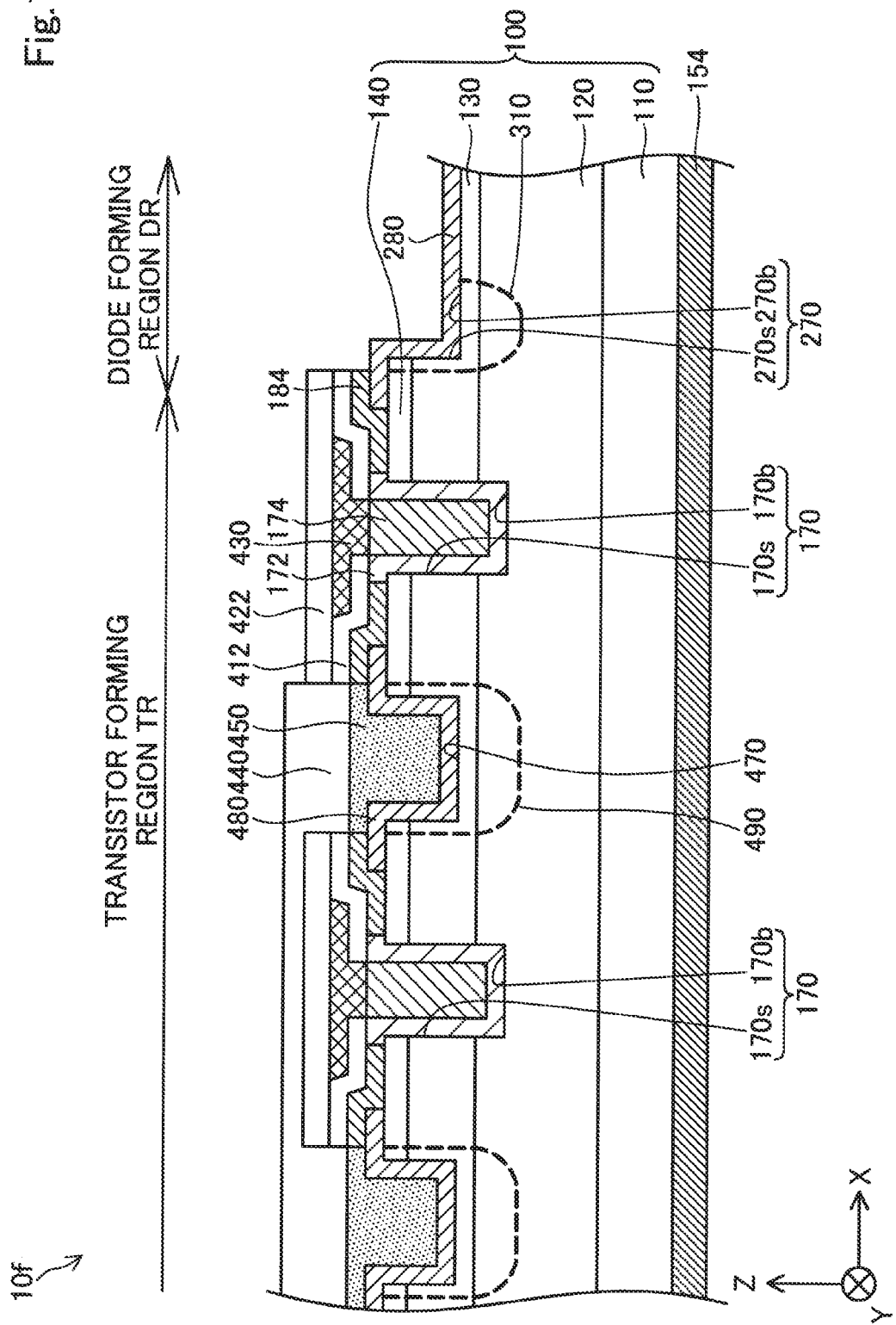
FIG. 13 is a schematic diagram illustrating part of a semiconductor device according to a sixth embodiment in cross section.

FIG. 13 is a schematic diagram illustrating part of a semiconductor device 10f according to a sixth embodiment in cross section. The semiconductor device 10f includes an insulation film 412, an insulation film 422, a gate wiring 430, a source wiring 440, a heat dissipation wiring 450, a source trench 470, a Schottky electrode 480, and a p-type impurity implantation region 490 in addition to the structure of the semiconductor device 10b according to the second embodiment.

The heat dissipation wiring 450 is disposed between a plurality of first grooves 170 in the transistor forming region TR. According to the sixth embodiment, therefore, when a voltage is applied to the second electrode 174, the heat dissipation wiring 450 can be disposed relatively close to a position where an inversion layer is formed in the p-type semiconductor layer 130. This can reduce heat generation in the semiconductor device 10f. Consequently, an increase in junction temperature at the pn junction can be restrained from degrading performance of the transistor.

G. Seventh Embodiment

Figure 14:
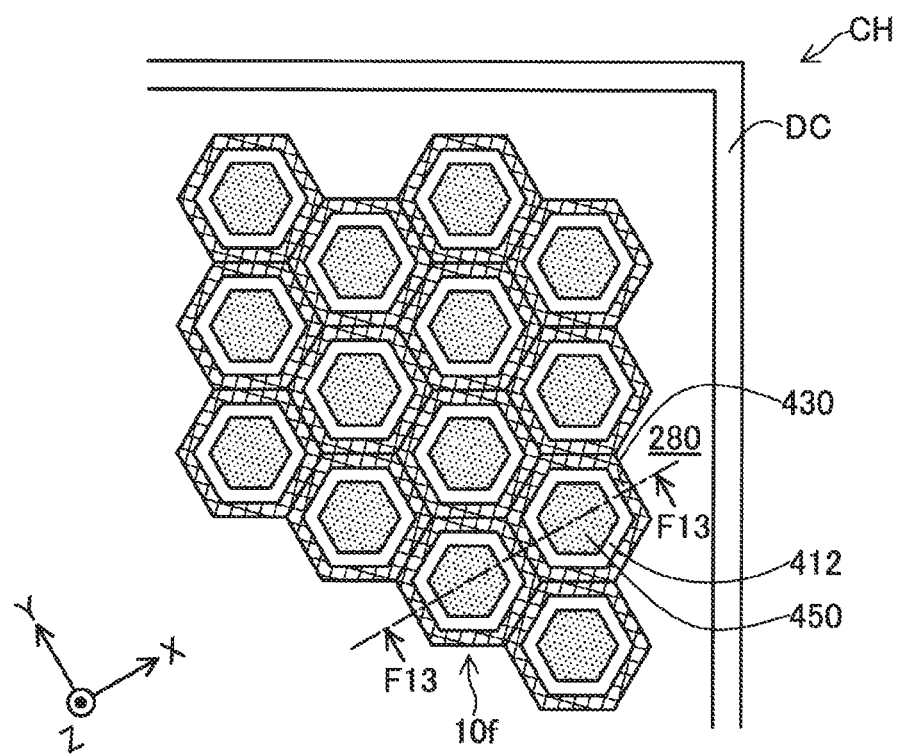
FIG. 14 is a schematic diagram illustrating a chip including the semiconductor device.

FIG. 14 is a schematic diagram illustrating a chip CH including the semiconductor device 10f, as viewed in the +Z-axis direction. In FIG. 14, the insulation film 422 and the source wiring 440 are omitted from the semiconductor device 10f. FIG. 13 illustrates the semiconductor device 10f in cross section, as viewed in a direction indicated by the arrows F13-F13 in FIG. 14.

In the chip CH, the semiconductor device 10f is arranged to position the diode forming region DR in a region (a region between the transistor forming region TR and a dicing street DC) that is used as an element separation region in a conventional chip. This makes it possible to incorporate the diode in the chip CH without making the size of the chip CH larger than the size of the conventional chip.

H. Modifications

In the second to fifth embodiments described above, the p-type impurity implantation region is formed. However, the present disclosure is not limited to this. For example, in an area where the p-type impurity implantation region is formed, a p-type base layer may be formed instead of the p-type impurity implantation region.

In the fourth embodiment described above, the p-type impurity deposition region 340 is formed in addition to the p-type impurity implantation region 310. However, the present disclosure is not limited to this. For example, the semiconductor device may only include the p-type impurity deposition region 340.

The disclosure is not limited to any of the embodiment and its modifications described above but may be implemented by a diversity of configurations without departing from the scope of the disclosure. For example, the technical features of any of the embodiments and their modifications may be replaced or combined appropriately, in order to solve part or all of the problems described above or in order to achieve part or all of the advantageous effects described above. Any of the technical features may be omitted appropriately unless the technical feature is described as essential in the description hereof. The present disclosure may be implemented by aspects described below.

(1) According to one aspect of the disclosure, a semiconductor device is provided. This semiconductor device comprises a stacked body and a first electrode. The stacked body includes: a first nitride semiconductor layer containing an n-type impurity; a second nitride semiconductor layer containing an n-type impurity; a third nitride semiconductor layer containing a p-type impurity; and a fourth nitride semiconductor layer containing an n-type impurity. The first nitride semiconductor layer, the second nitride semiconductor layer, the third nitride semiconductor layer, and the fourth nitride semiconductor layer are stacked in sequence. The first electrode is in contact with a surface of the first nitride semiconductor layer that is opposite to a surface in contact with the second nitride semiconductor layer. The semiconductor device includes a transistor forming region where a transistor is formed and a diode forming region where a diode is formed. The diode forming region is adjacent to the transistor forming region. The transistor forming region includes a first groove, a second electrode, and a third electrode. The first groove penetrates the third nitride semiconductor layer and the fourth nitride semiconductor layer and has a bottom portion located in the second nitride semiconductor layer. The second electrode is formed on a surface of the first groove through an insulation film. The third electrode is in contact with a surface of the fourth nitride semiconductor layer that is opposite to a surface in contact with the third nitride semiconductor layer. The diode forming region includes a second groove and a Schottky electrode. The second groove penetrates the fourth nitride semiconductor layer and has a bottom portion located in the third nitride semiconductor layer. The Schottky electrode is formed on a surface of the second groove, makes a Schottky barrier junction with the third nitride semiconductor layer, and is electrically connected to the third electrode. According to this aspect, a high electric field region can be restrained from being formed in part of the second semiconductor layer that is closer to the first nitride semiconductor layer. This can suppress breakage of the diode.

(2) In the semiconductor device according to the above aspect, the diode forming region may further include at least one p-type impurity implantation region formed by implanting a p-type impurity into the stacked body through the second groove. According to this aspect, even when a highly concentrated n-type impurity region is unintentionally formed on the second groove, the p-type impurity implantation region is formed from the second groove toward the stacked body to compensate for the highly concentrated n-type impurity region.

(3) In the semiconductor device according to the above aspect, at least one of the p-type impurity implantation regions may be extended to a position deeper than a level of the bottom portion of the first groove. According to this aspect, electric field concentration at the bottom portion of the first groove can be relieved.

(4) In the semiconductor device according to the above aspect, at least one of the p-type impurity implantation regions may be extended from a side portion of the second groove toward the stacked body. According to this aspect, even when a highly concentrated n-type impurity region is unintentionally formed on the second groove, the p-type impurity implantation region compensates for the highly concentrated n-type impurity region so as to suppress formation of a leak path from the fourth nitride semiconductor layer through the highly concentrated n-type impurity region.

(5) In the semiconductor device according to the above aspect, the diode forming region may further includes a p-type impurity deposition region formed by depositing a p-type impurity on a surface of the second groove and interposed between the Schottky electrode and the second groove. According to this aspect, even when a highly concentrated n-type impurity region is unintentionally formed on the second groove, the p-type impurity deposition region compensates for the highly concentrated n-type impurity region so as to suppress formation of a leak path from the fourth nitride semiconductor layer through the highly concentrated n-type impurity region.

Other than the semiconductor device and a method of manufacturing the semiconductor device, the present disclosure may be implemented in various modes, for example, an electric apparatus including the semiconductor device, an apparatus of manufacturing the semiconductor device, a method of designing the apparatuses, and a method of manufacturing the apparatuses.

The present disclosure can suppress formation of a high electric field region in part of the second semiconductor layer that is closer to the first nitride semiconductor layer. This can suppress breakage of the diode.

What is claimed is:

1. A semiconductor device comprising:
   a stacked body including: a first nitride semiconductor layer containing an n-type impurity; a second nitride semiconductor layer containing an n-type impurity; a third nitride semiconductor layer containing a p-type impurity; and a fourth nitride semiconductor layer containing an n-type impurity, the first nitride semiconductor layer, the second nitride semiconductor layer, the third nitride semiconductor layer, and the fourth nitride semiconductor layer being stacked in sequence; and
   a first electrode in contact with a surface of the first nitride semiconductor layer that is opposite to a surface in contact with the second nitride semiconductor layer, wherein
   the semiconductor device includes:
      a transistor forming region where a transistor is formed; and
      a diode forming region where a diode is formed, the diode forming region being adjacent to the transistor forming region,
   the transistor forming region includes:
      a first groove penetrating the third nitride semiconductor layer and the fourth nitride semiconductor layer and having a bottom portion located in the second nitride semiconductor layer;
      a second electrode formed on a surface of the first groove through an insulation film; and
      a third electrode in contact with a surface of the fourth nitride semiconductor layer that is opposite to a surface in contact with the third nitride semiconductor layer,
   the diode forming region includes:
      a second groove penetrating the fourth nitride semiconductor layer and having a bottom portion located in the third nitride semiconductor layer;
      a Schottky electrode that is formed on a surface of the second groove, makes a Schottky barrier junction with the third nitride semiconductor layer, and is electrically connected to the third electrode, and
      at least one p-type impurity implantation region formed by implanting a p-type impurity into the stacked body through the second groove, and
   at least one of the p-type impurity implantation regions is extended to a position deeper than a level of the bottom portion of the first groove.

2. The semiconductor device according to claim 1, wherein at least one of the p-type impurity implantation regions is extended from a side portion of the second groove toward the stacked body.

3. The semiconductor device according to claim 1, wherein the diode forming region further includes a p-type impurity deposition region formed by depositing a p-type impurity on a surface of the second groove and interposed between the Schottky electrode and the second groove.

* * * * *